United States Patent
Pothireddy et al.

(10) Patent No.: US 10,541,676 B2
(45) Date of Patent: Jan. 21, 2020

(54) SYMMETRICAL DUAL VOLTAGE LEVEL INPUT-OUTPUT CIRCUITRY

(71) Applicant: Texas Instruments Incorporated, Dallas, TX (US)

(72) Inventors: Venkateswara Reddy Pothireddy, Plano, TX (US); Wahed Abdul Mohammed, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/057,211

(22) Filed: Aug. 7, 2018

(65) Prior Publication Data
US 2019/0058460 A1    Feb. 21, 2019

Related U.S. Application Data

(60) Provisional application No. 62/546,720, filed on Aug. 17, 2017, provisional application No. 62/612,391, filed on Dec. 30, 2017.

(51) Int. Cl.
*H03K 3/012* (2006.01)
*H03K 17/687* (2006.01)
*H03K 19/0185* (2006.01)

(52) U.S. Cl.
CPC .......... *H03K 3/012* (2013.01); *H03K 17/687* (2013.01); *H03K 19/018507* (2013.01)

(58) Field of Classification Search
None
See application file for complete search history.

(56) References Cited

U.S. PATENT DOCUMENTS

| | | | |
|---|---|---|---|
| 7,863,962 B2* | 1/2011 | Pasqualini | H03K 19/00315 326/81 |
| 8,994,412 B2* | 3/2015 | Kim | H03K 17/08104 327/109 |
| 9,293,179 B2* | 3/2016 | Wu | H03K 3/35613 |
| 10,027,321 B2* | 7/2018 | Chiang | H03K 17/6871 |

* cited by examiner

*Primary Examiner* — Jeffery S Zweizig
(74) *Attorney, Agent, or Firm* — Ebby Abraham; Charles A. Brill; Frank D. Cimino

(57) ABSTRACT

In a described example, an apparatus includes a driver circuit coupled to an output pad, the driver having a p-channel FET coupled between a positive peripheral voltage and the pad, and having a first gate terminal coupled to a first gate control signal, and an n-channel FET coupled between the pad and a ground terminal and having a second gate terminal coupled to a second gate control signal. A predriver circuit is coupled to receive a data signal for output to the pad and further coupled to output the first gate control signal; and the predriver circuit is coupled to output a supply voltage to the first gate control signal in a first mode, and to output a bias voltage less than the supply voltage to the first gate control signal in a second mode; and a bias circuit is coupled for outputting the bias voltage.

15 Claims, 8 Drawing Sheets

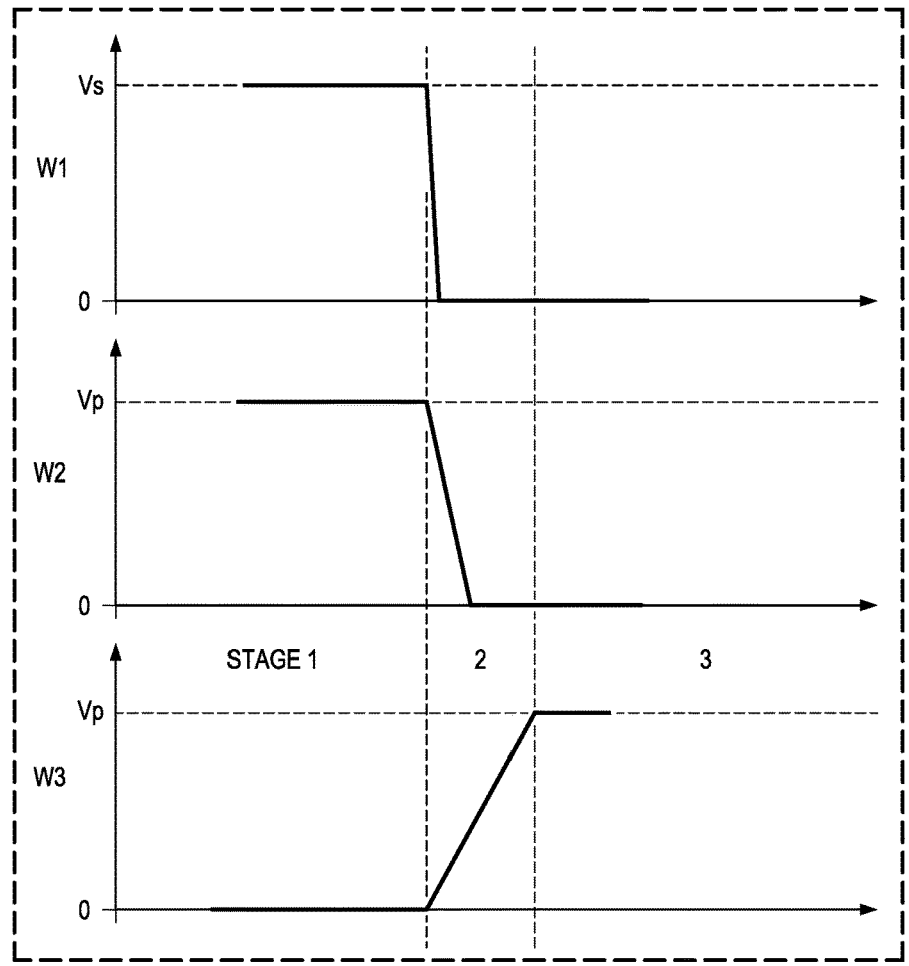

FIG. 6B
| | | | | | | | 683 |
|---|---|---|---|---|---|---|---|
| A | A | A | A | A | 450 | MODE | |
| A | A | A | A | A | 430 | LS | |
| E | D | D | D | D | 452 | PH | |
| D | E | D | D | D | 454 | PL | |
| D | D | E | D | D | 456 | VB | |
| D | D | D | E | E | 458 | PB | |
| D | A | A | D | D | 460 | PCD | |
| D | A | A | A | A | 462 | PD | |
| D | E | E | E | E | 434 | DRV | |
| 1 | 2 | 3 | 4 | 5 | ← STAGE | | |
680 T2
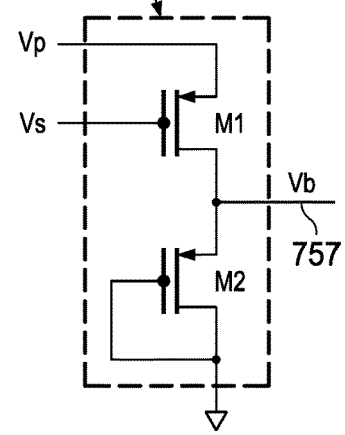
FIG. 7
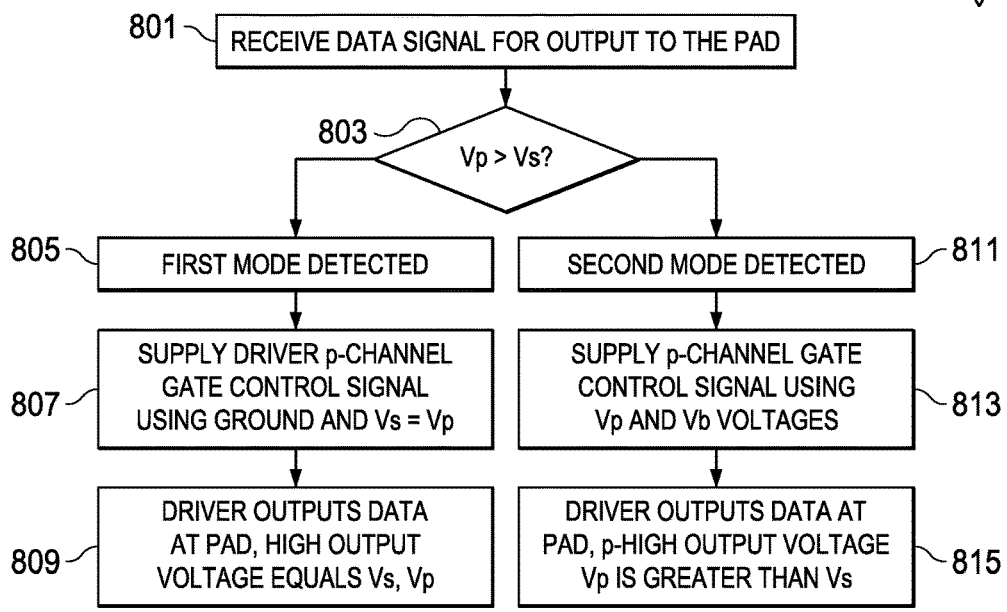
FIG. 8

SYMMETRICAL DUAL VOLTAGE LEVEL INPUT-OUTPUT CIRCUITRY

CROSS REFERENCE TO RELATED APPLICATIONS

This application claims the benefit under 35 U.S.C. § 119(e) to co-owned U.S. Provisional Patent Application Ser. No. 62/546,720, filed Aug. 17, 2017, titled "Area Efficient, Near Zero Static Current Dual Voltage (1.8v/3.3v) LVCMOS IO in 1.8v CMOS Technology," and to co-owned U.S. Provisional Patent Application Ser. No. 62/612,391, filed Dec. 30, 2017, titled "Symmetrical Dual Voltage Level Input-Output Circuitry," each of which is hereby incorporated by reference in its entirety herein.

TECHNICAL FIELD

This disclosure relates generally to dual voltage input-output circuits, and more particularly to dual voltage driver circuitry using low power to provide symmetrical rise and fall transitions.

BACKGROUND

Multi-voltage input-output (I/O) integrated circuit (IC) designs are common for battery powered mobile devices. To maintain compatibility between the IC and other circuits in a system operating at different voltage levels, interface cells are used within the IC that serve as level shifters to protect lower internal voltage circuitry from higher voltages. The input-output stages of the IC can operate at different voltage levels to make output signals from the IC compatible with other components operating at differing voltage levels.

In battery powered applications, conservation of power prolongs the usefulness of the device for each battery charge. With increasing data bus widths and with systems including additional voltage domains or sections that can be powered down, increasing numbers of level shifters are required. With the increasing number of interface cells, all characteristics of the interface cell become important: layout size; quiescent power; speed; and signal symmetry.

SUMMARY

In a described example, an apparatus includes a driver circuit coupled to an output pad, the driver circuit having a p-channel FET coupled between a positive peripheral voltage and the pad, and having a first gate terminal coupled to a first gate control signal, and an n-channel FET coupled between the pad and a ground terminal and having a second gate terminal coupled to a second gate control signal; a predriver circuit configured to receive a data signal for output to the pad and further configured to output the first gate control signal and to output the second gate control signal, the predriver circuit configured to output a supply voltage to the first gate control signal in a first mode, and to output a bias voltage less than the supply voltage to the first gate control signal in a second mode, the predriver circuit configured to output the supply voltage to the second gate control signal in both the first and second modes; and a bias circuit for outputting the bias voltage.

BRIEF DESCRIPTION OF THE DRAWINGS

FIGS. 5A and 5B show p-channel pre-driver waveforms and a functionality table of an example pre-driver operating in a first mode.

FIGS. 6A and 6B show pre-driver waveforms and a functionality table of an example p-channel pre-driver operating in a second mode.

FIG. 7 is a schematic of an example circuit for generating the bias voltage Vb in the p-channel pre-driver of FIG. 4.

FIG. 8 is a flow diagram for a method.

DETAILED DESCRIPTION

Corresponding numerals and symbols in the different figures generally refer to corresponding parts unless otherwise indicated. The figures are not necessarily drawn to scale. The term "coupled" may include connections made with intervening elements, and additional elements and various connections may exist between any elements that are "coupled."

Figure 1:
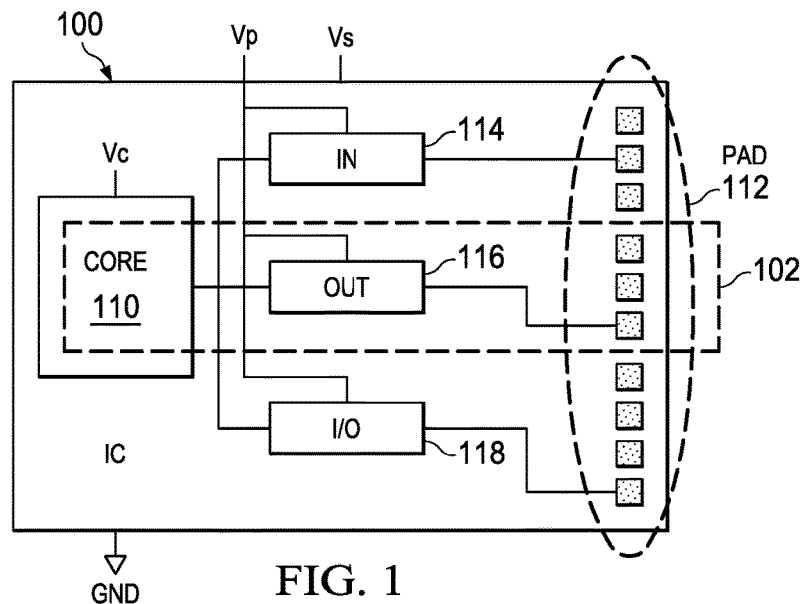
FIG. 1 is a block diagram of an integrated circuit.

FIG. 1 is a block diagram of an example IC 100. IC 100 contains a core logic block CORE 110 coupled to three input and output drivers: IN 114; OUT 116; and I/O 118. The input and output drivers are coupled to a set of pads labeled PAD 112. In this example, ten pads 112 are shown in FIG. 1 with only three pads shown connected to input or output stages, for clarity. CORE 110 is coupled to an internal power supply voltage Vc. IC 100 is coupled to a system power supply that outputs a voltage Vs, a peripheral supply that outputs a voltage Vp, and a negative common power supply terminal GND. Within IC 100, the core voltage Vc is different from the system voltage Vs, and is usually lower than the system voltage Vs. By operating internal circuitry at this lower core voltage Vc, power consumption is reduced compared to operating the internal circuitry at the higher system voltage Vs. The system voltage Vs is lower than or equal to the peripheral supply voltage Vp. Core voltages such as Vc can be between 0.8 volts and 1.2 volts, or higher, system voltages are around 1.8 volts. Peripheral voltages may be at 1.8 volts or at 3.3 volts or another useful voltage, such as 5.0-6.0 volts. In an example, the peripheral voltage Vp is selected from 1.8 volts or 3.3 volts. Having the option to operate IC 100 with the peripheral voltage Vp at a selectable voltage enables the IC 100 to be compatible with signals from components that operate on a system voltage of 3.3 volts, even while the IC 100 operates at a system voltage of 1.8 volts, for example. Because of the different voltage levels among the voltages Vc, Vs, and Vp, interface cells containing level shifters may be used between voltage domains within IC 100. The voltage differences between Vc and Vs are known at design time, however, the voltage level of Vp is selectable, so a mode selectable interface cell is used to adapt the input-output circuitry (sometimes referred to as "peripheral" circuitry) to the different possible Vp voltage levels. Section 102 in FIG. 1 includes a single output flow from the core logic CORE 110 to one of the pads in the set of pads 112.

Figure 2:
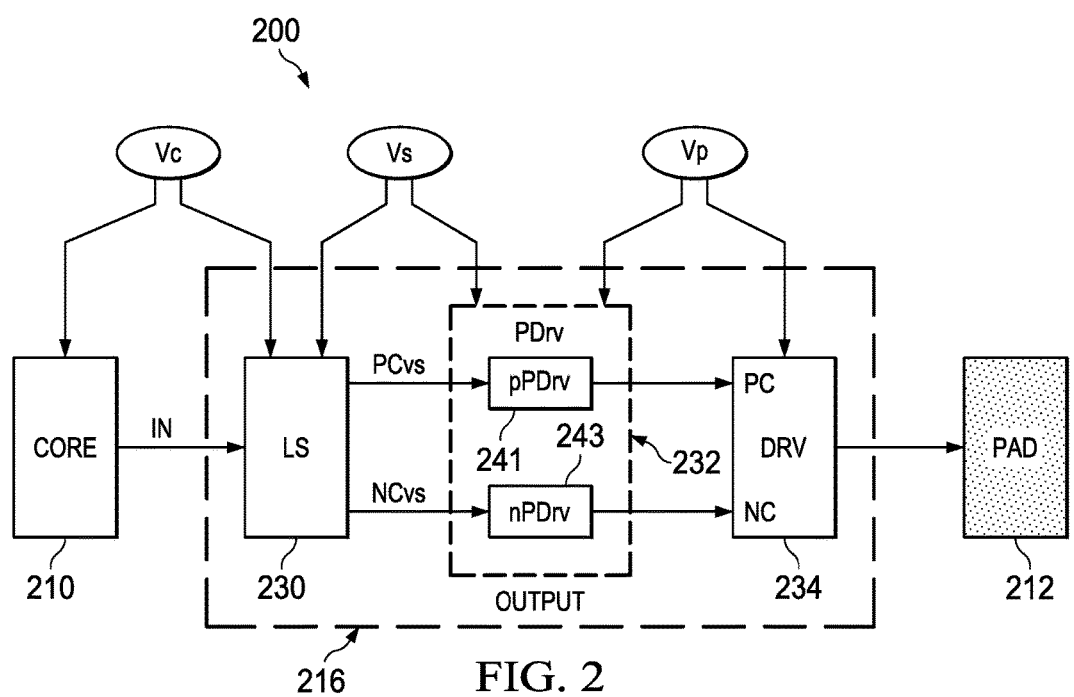
FIG. 2 is a block diagram of an output stage showing flow from core logic to an output pad.

FIG. 2 is a block diagram showing an example with an output flow from a core logic to a pad, similar to the section 102 in FIG. 1. In output flow 200, there are three primary blocks: CORE 210; OUTPUT 216; and PAD 212. Within the OUTPUT 216 are four blocks: level shifter LS 230; pre-drive circuitry PDry 232, and driver circuit DRV 234. Within the PDry 232 are two blocks: p-channel pre-driver pPDry 241; and n-channel pre-driver nPDry 243. CORE 210 is coupled to level shifter LS 230. LS 230 has an input IN and two outputs, PCvs, a p-channel level shifted gate control signal coupled to pPDry 241; and NCvs, an n-channel level shifted gate control signal coupled to nPDry 243. A pair of FET transistors within the driver DRV 234 (not shown in FIG. 2 but see FIG. 3A) will be controlled by coupling the signals PC and NC to the respective gate terminals, as is further described hereinbelow. The output of pPDry 241 is coupled to the p-channel PC input of DRV 234. The output of nPDry 243 is coupled to the n-channel NC input of the driver block DRV 234. The output of DRV 234 is coupled to PAD 212. PAD 212 represents the output terminal or bond pad of an IC. A core supply voltage Vc is coupled to CORE 210 and LS 230, the system voltage supply Vs is coupled to LS 230 and PDry 232 and the peripheral supply voltage Vp is coupled to PDry 232 and DRV 234. The ground voltage terminal is not shown for clarity.

In a first mode the peripheral voltage Vp and the system voltage Vs may be equal, at 1.8 volts for example. The core voltage Vc is derived from the system power Vs and may be 1.0 volts. In operation, the signals from CORE 210 propagate to the level shifter LS 230. LS 230 protects the components within CORE 210 from the higher voltage of Vs. LS 230 produces a signal for the p-channel pre-driver and the n-channel pre-driver in the system voltage domain. To maintain a symmetrical rise and fall time of the output signal at PAD 212, the rise time of the DRV 234 signal NC needs to be the same as the fall time of the DRV 234 signal PC. In this first mode, the high voltage and low voltage points are 0 volts and Vp for both the PC and NC signals.

In a second mode, voltages Vc and Vs remain at 1.8 volts, the same as in the first mode, and now the peripheral voltage Vp is selected as 3.3 volts. To maintain symmetrical rise and fall time at PAD 212, the rise and fall times of the DRV input signals PC, NC still need to the same. The ideal mid-point voltage between supplies (usually referred to as Vmid) for a 3.3 volt system is 1.65 volts for generating symmetrical rise and fall times. With this midpoint voltage supply Vmid available, the signal NC input to the DRV block for the N-channel device can have a high voltage of Vmid, or 1.65 volts, and a low voltage of 0 volts, a delta of 1.65 volts. The DRV input signal PC can have a high voltage of 3.3 volts and a low voltage of 1.65 volts, a delta of 1.65 volts. This arrangement will provide for symmetrical rise and fall time at PAD 212 because the gate signals NC and PC to the driver circuit DRV 234 are symmetric.

However, to generate a midpoint voltage Vmid, a voltage divider using resistors is used. These resistors consume static power and also require a considerable amount of silicon area for fabrication, compared to transistor space. Neither the static current draw nor the extra space consumed of a resistor voltage divider is desirable. In an example arrangement, a substitute bias voltage Vb will be used in place of a midpoint voltage Vmid to ensure symmetric transitions. To save power and space, the example bias generator uses the available system voltage Vs and the available peripheral voltage Vp in a selectable subtraction circuit to create a bias voltage Vb. In this example, with Vs=1.8 volts and Vp=3.3 volts, Vb=Vp−Vs=1.5 volts. In the circuit for the bias voltage Vb, no resistors are used and no static power is consumed, both improvements desirable in the interface cell.

Figure 3A:
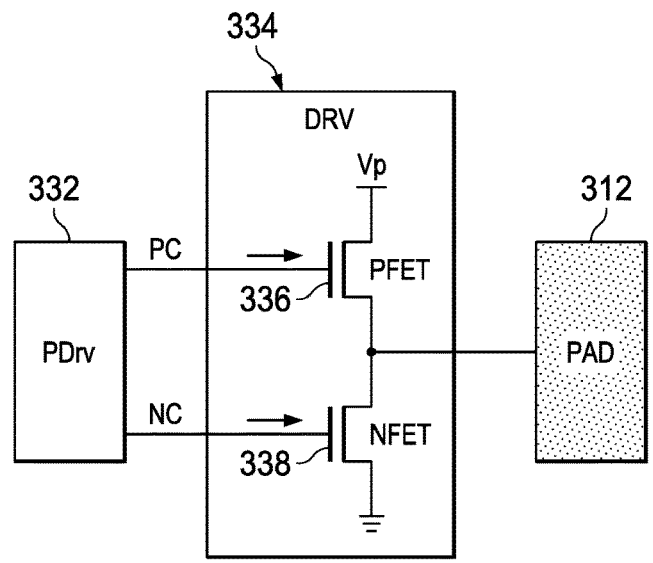
FIGS. 3A, 3B, 3C and 3D show a block diagram of a driver and three waveform sets showing two modes of operation with Vs, Vmid and Vb, respectively.
Figure 3B:
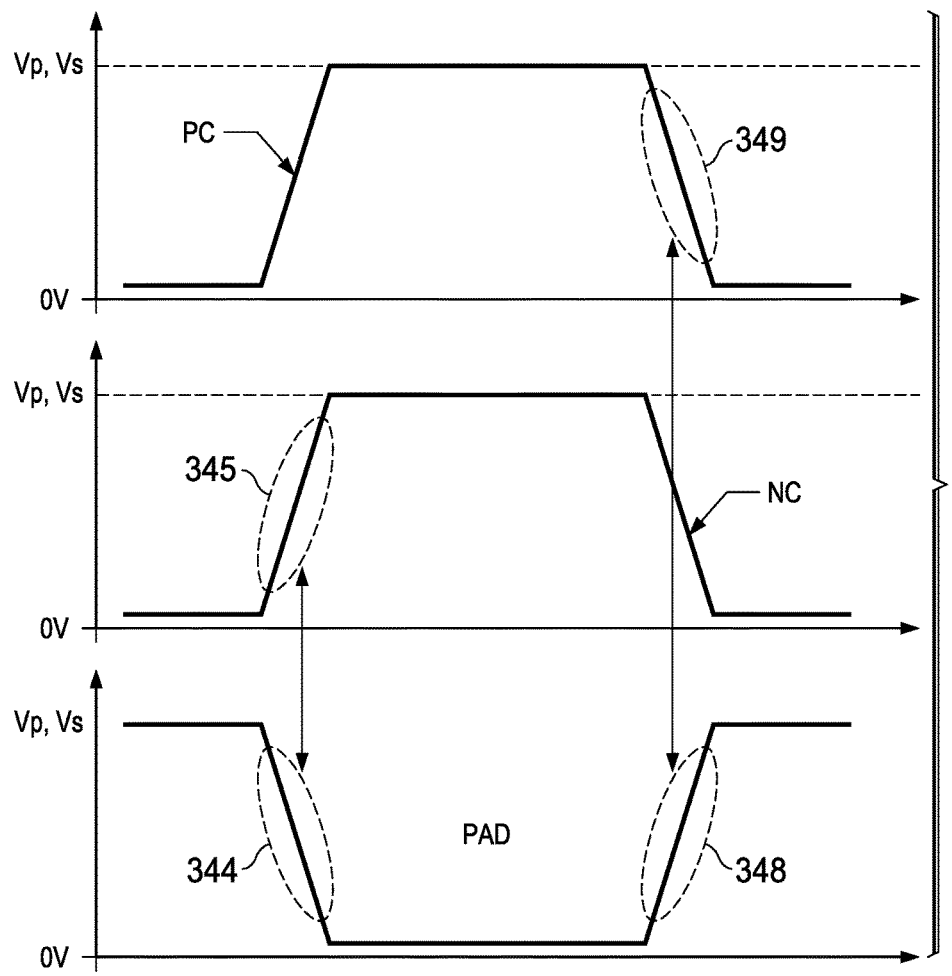
Figure 3C:
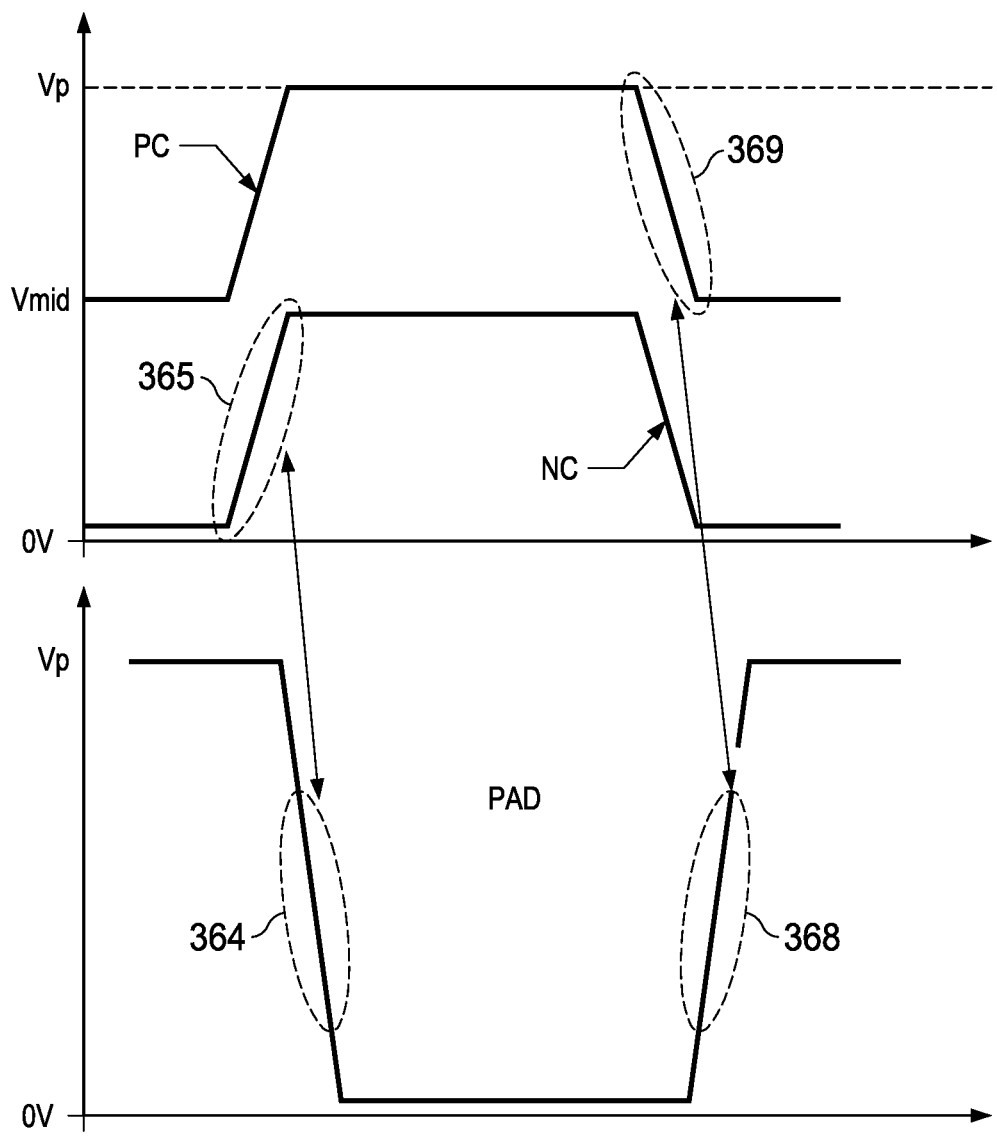
Figure 3D:
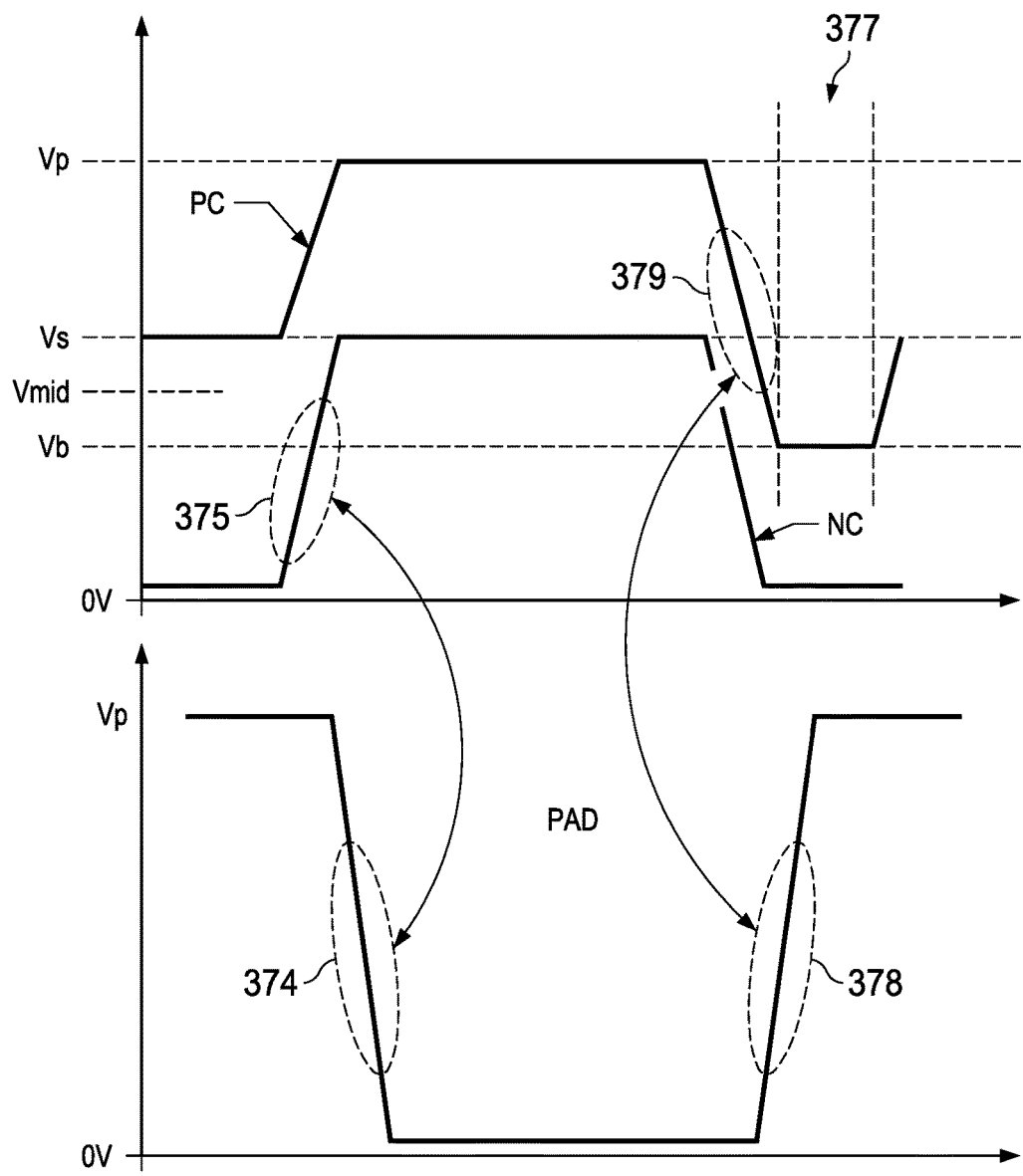

FIG. 3A is a block diagram, while FIGS. 3B, 3C and 3D are three waveform diagrams showing the two modes of operation with the voltages Vs, Vmid and Vb, respectively. Note that the voltage Vmid is not used in the examples but is shown here for explaining the operations. FIG. 3A has three blocks, a pre-driver PDry 332, DRV 334 and PAD 312. In FIG. 3A, similar labels are used for elements similar to those shown in FIG. 2, for clarity. For example pad 312 corresponds to pad 212 in FIG. 2. Within DRV 334 is a p-channel drain extended metal oxide semiconductor (DEMOS) P-type field-effect-transistor (PFET) 336 and an n-channel DEMOS NFET 338. PFET 336 source terminal is coupled to Vp. The PFET 336 drain terminal is coupled to the NFET 338 drain terminal. The NFET 338 source terminal is coupled to ground. The PFET 336 gate terminal is coupled to the PDry 332 output PC. The NFET gate terminal is coupled to the PDry 332 output NC. Note that the PFET 336 and the NFET 338 in FIG. 3A are both shown as drain extended MOS (DEMOS) devices that can tolerate a greater range on the voltage between drain and source (Vds) than standard MOS devices. Thus the use of a voltage range of Vp to ground at the pad PAD 312, which places a Vds range of 3.3 volts on the NFET 338 and PFET 336, is within an acceptable range for the DEMOS devices. Other types of power FET devices can be used in the driver 334 to form additional examples.

In FIG. 3B, there are three waveforms plotted on three axis sets with identical vertical and horizontal axis units and scale, for clarity. The horizontal axis is time and the vertical axis is volts. In FIG. 3B the maximum voltage is at Vp=Vs=1.8 volts in this example. Waveforms PC and NC are from the PC and NC outputs of PDry 332 of FIG. 3A, respectively. The PAD waveform is from PAD 312 of FIG. 3A. The waveforms of FIG. 3B correspond to the first mode operation where Vp=Vs. Because in this example Vs=1.8 volts, Vp=1.8 volts, the max voltage of PAD 312 is 1.8 volts as seen in the waveform labeled PAD of FIG. 3B. The falling edge 344 of PAD in FIG. 3B is a result of the rising edge 345 of the gate terminal of NFET 338 within DRV 334. The rising edge 348 of PAD in FIG. 3B is a result of the falling edge 349 of the gate terminal of the PFET 336 within DRV 334. In FIG. 3B the gate terminal of PFET 336 (waveform PC) and the gate terminal of NFET 338 (waveform NC) transition from 0 to 1.8 volts, resulting in symmetrical rise and fall times in the waveform PAD. Note that when either the PFET 336 and NFET 338 within DRV 334 turns on, the complimentary FET turns off in a timing (not shown) that prevents a condition called "shoot through." Shoot through is an undesirable condition where the PFET 336 and NFET 338 are both on forming a short between Vp and ground. If that condition occurs current "shoots through" from Vp to ground. The waveforms NC and PC are arranged to prevent this condition from occurring.

In FIG. 3C, there are three waveforms plotted on two axis sets with identical vertical and horizontal axis units and scale for clarity. The horizontal axis is time and the vertical axis is volts with the maximum being equal to Vp which is 3.3 volts in this example. Waveforms PC and NC are from the PC and NC outputs of PDry 332 of FIG. 3A, respectively. The PAD waveform is from PAD 312 of FIG. 3A. The waveforms of FIG. 3C correspond to the second mode operation, where Vp=3.3 volts and Vs=1.8 volts. Because Vp=3.3 volts, the max voltage of PAD 312 is 3.3 volts as seen in waveform PAD of FIG. 3C. The falling edge 364 of PAD 312 in FIG. 3C is a result of the rising edge 365 of gate terminal of NFET 338 within DRV 334. The rising edge 368 of PAD in FIG. 3C is a result of the falling edge 369 of gate terminal PFET 336 within DRV 334. In an approach the voltage Vs could be used as the middle voltage in the second mode (Vs=1.8 volts, while Vp=3.3 volts). PFET 336 could operate between Vp and Vs because the voltage transition is 3.3−1.8=1.5 volts, however the 1.5 volt transition results in asymmetrical rise and fall times because the gate terminals of the PFET 336 and NFET 338 would transition across different voltages (1.5 volts and 1.8 volts respectively). In the example shown in FIG. 3C, a voltage Vmid (Vp/2) is used instead of Vs. Vmid is 3.3 volts/2, or 1.65 volts. Using a midpoint voltage Vmid results in a symmetrical rise and fall time as described hereinabove, but may require additional circuitry to form a voltage divider. In an example where a resistor voltage divider is used, this results in static current consumption, increasing power as was described hereinabove.

FIG. 3D contains three waveforms showing an example operation plotted on two axis sets with identical vertical and horizontal axis units and scale for clarity. The horizontal axis is time and the vertical axis is volts with the maximum being Vp or 3.3 volts in this example. Waveforms PC and NC are from the PC and NC outputs of PDry 332 of FIG. 3A, respectively. The PAD waveform is from PAD 312 of FIG. 3A. The waveforms of FIG. 3D correspond to the second mode operation where Vp=3.3 volts and Vs=1.8 volts. Because Vp=3.3 volts, the max voltage of PAD 312 is 3.3 volts as seen in waveform PAD of FIG. 3D.

The falling edge 374 of PAD 312 in FIG. 3D is a result of the rising edge 375 of gate terminal of NFET 338 within DRV 334. The change in gate voltage is 1.8 volts because the transition is from 0 to Vs or 1.8 volts. The operation of NC in FIG. 3D is identical to the operation of NC in FIG. 3B. The rising edge 378 of PAD in FIG. 3D is a result of the falling edge 379 of gate terminal PFET 336 within DRV 334. To ensure rise time 368 is symmetrical to fall time 374, the gate terminal of PFET 336 PC transitions to a bias voltage Vb that is Vp−Vs (3.3−1.8)=1.5 volts. To conserve static power, Vb is provided by a selectable voltage source only requiring power during the transition period 377 as seen in FIG. 3D. To conserve layout space, the voltage Vb is created with an example arrangement voltage subtraction circuit (described hereinbelow) that subtracts external power supply Vs from external power supply Vp. Because both gate signals NC and PC transition from a high voltage to a low voltage over a 1.8 volt range, the two gate control signals are symmetric for driving the PAD output.

The operation of the NFET 338 is identical in the first and second modes as seen in the waveform NC in FIG. 3B and FIG. 3D respectively. The rise time of PAD 312 is determined by the fall time of PC 379 as seen in FIG. 3D. A detailed review of the operation of the fall time of PFET 336 pre-driver is presented hereinbelow.

Figure 4:
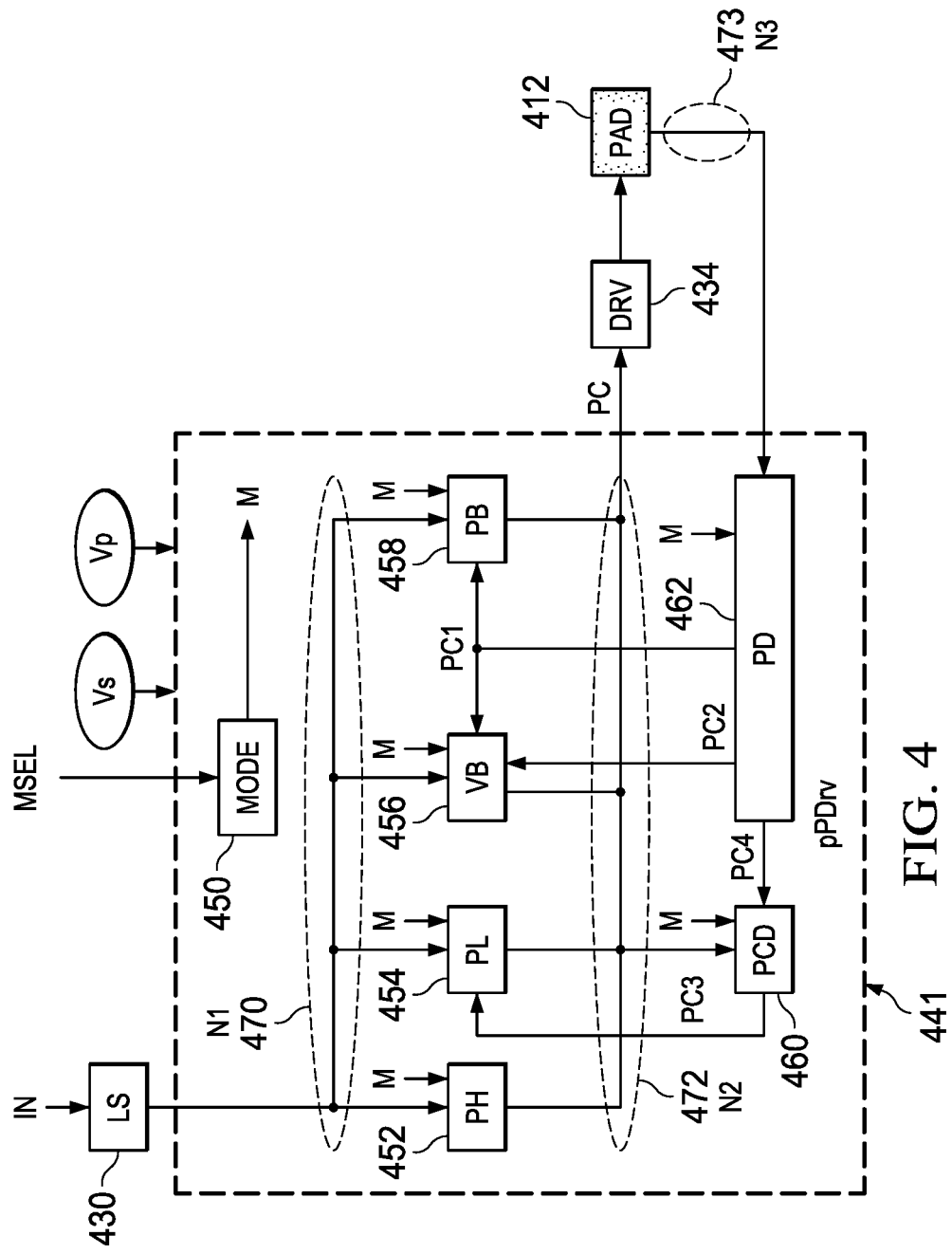
FIG. 4 is a block diagram of an example p-channel pre-driver circuit.

FIG. 4 is a block diagram of an example p-channel pre-driver. In FIG. 4 there are seven blocks within the p-channel p-driver 441: mode select logic circuit MODE 450; pull up high PH 452; pull down low PL 454; bias voltage VB 456; pull up to Vb PB 458; p-channel output detect PCD 460; and pad detect PD 462. The output of the p-channel predriver pPDry 441 PC is coupled to driver DRV 434. DRV 434 drives the output terminal PAD 412. pPDry 441 has two voltage supplies: system voltage Vs; and peripheral voltage Vp. The common or ground voltage terminal is not shown for clarity. pPDry 441 has two inputs: mode select MSEL; and the p-channel input signal at node 470 from level shifter LS 430. Six blocks have enable signals M from MODE 450: PH 452; PL 454; VB 456; PB 458; PCD 460; and PD 462. Three nodes are identified for waveform analysis: Node N1 470 is the level shifted input PC to pPDry 441; node 472 is the output PC of pPDry 441 to DRV 434; and the node N3 475 is the voltage at PAD 412. Node N1 470 is coupled to blocks PH 452, PL 454, VB 456 and PB 458. Node 472 is coupled to PH 452, PL 454, VB 456, PB 458, and PCD 460. Node N3 is coupled to PAD 412 and PD 462. PCD 460 has an output PC3 coupled to PL 454. PD 462 has three outputs: PC1 is coupled to blocks VB 456 and PB 458; PC2 is coupled to VB; and PC4 is coupled to PCD 460.

Level shifter LS 430 translates input signals at terminal IN from circuitry at the core logic level voltage Vc to level shifted input signals at the system voltage Vs on node N1 470. MODE 450 is combinational logic circuit that enables or disables certain blocks within pPDry 441 based on a mode select input. The mode is determined by the peripheral voltage Vp, such as 1.8 volts or 3.3 volts. A voltage comparator can determine when an external input peripheral voltage Vp is greater than 1.8 volts, for example. PH 452 selectively pulls up node N2 472 to the peripheral voltage Vp. PL 454 selectively pulls down N2 472 to the low logic level, near 0 volts. VB 456 is a low power, selective bias voltage generator that creates a voltage Vb of Vp less Vs and selectively pulls node 472 down to Vb. PB 458 selectively pulls up node N2 472 to Vs. PCD 460 monitors the voltage of node 472 and when node 472 is less than Vb, PCD 460 disables PL 454 and enables VB 456. In operation, PD 462 monitors the voltage of PAD 412 and when node N3 473 is greater than a threshold voltage Vtd, PD 462 disables VB 456 and enables PB 458. In an example, the voltage Vtd is 90% of Vp. The block diagram of FIG. 4 discussed hereinbelow illustrates the block operation in the two operational modes: a first mode where Vp=Vs=1.8 volts; and a second mode where Vp=3.3 volts and Vs=1.8 volts. Other system voltages Vs and other peripheral voltages Vp can be used and these alternatives form other example arrangements. Generally, in the first mode the supply voltage Vs and the peripheral voltage Vp are approximately equal, and in the second mode, the peripheral voltage Vp is greater than the supply voltage Vs by greater than 0.5 volts, or more. In an example arrangement, the block diagram of FIG. 4 can be implemented as part of an integrated circuit. In an alternative arrangement, the predriver pPDRV 441 and the level shifter 430 can be part of an integrated circuit while the driver circuit 434 can be power FET devices in a separate integrated circuit such as a DEMOS FET driver circuit.

FIGS. 5A and 5B show p-channel pre-driver waveforms and a functionality table of an example pre-driver arrangement operating in the first mode. FIG. 5A shows three waveforms W1, W2, W3, at three nodes shown in FIG. 4, N1 470, N2 472, and N3 473. The waveforms W1, W2, W3 illustrate operation during three stages of a rising output signal at the PAD 412. FIG. 5B is a table T1 580 that shows the status of functional blocks within the block diagram of FIG. 4. Status definitions used in the table of FIG. 5B are: active (A); enabled (E); or disabled (D). An active state A has switching during the time period. An enabled state E has no switching, but is enabled to create bias or preserve an output state. A disabled state D is neither active nor enabled and consumes only leakage current.

For the three waveforms W1, W2 and W3 shown in FIG. 5A, the vertical axis on each waveform is voltage and the horizontal axis is time. The waveform W1 shows the voltage of node N1 470 identified in FIG. 4 and the logic high voltage at the system voltage Vs. The middle waveform W2 shows the voltage of node N2 472 identified in FIG. 4 and a logic high of the peripheral voltage Vp. The waveform W3 shows the voltage of node N3 473 identified in FIG. 4 and the logic high of the peripheral voltage Vp.

In FIG. 5A three stages are identified: Stage 1 is the steady state time while the pad voltage is logic low; Stage 2 is the transition between logic low and logic high at the pad; and stage 3 is the steady state time after the pad voltage has reached the logic high state.

In FIG. 5B, table T1 580 shows the first nine rows that correspond to the corresponding indexed blocks in FIG. 4, the tenth row corresponds to the stage numbers from the waveforms in FIG. 5A. Columns one, two and three correspond to the stages 1, 2, and 3 in FIG. 5A. The fourth and fifth columns are the identifier number and label of the blocks from FIG. 4. The letters in the cells of the first, second and third columns correspond to the status of the blocks during the stages shown in FIG. 5A.

In the example, in the first mode operation: Vs=Vp=1.8 volts; MSEL is configured for Vp=1.8 volts; a group of two blocks 583 are always active for the three stages, the MODE 450 and LS 430; and in this mode of operation a group of four blocks in group 585 are disabled for the three stages, VB 456, PB 458, PCD 460, PD 462. The four blocks in group 585 are disabled to conserve both static and dynamic current.

During stage 1, as shown in FIG. 5A: waveform W1 is logic high at the system voltage Vs; waveform W2 is logic high at the peripheral voltage Vp; and waveform W3 is at a logic low. In the stage 1, as shown in column of table T1 580: PH 452 is enabled (E) to pull up node N2 to Vs; PL 554 is disabled (D); and DRV 534 is disabled (D).

During stage 2, again referring to FIG. 5A: waveform W1 transitions from logic high, Vs, to logic low, 0 volts; waveform W2 transitions from logic high, Vp, to logic low, 0 volts; and waveform W3 transitions from logic low, 0 volts, to logic high, Vp. The stage 2 column of table T1 580 shows that during the transition, the block PH 452 is disabled (D); PL 454 is enabled (E) to pull down node N2 472 toward 0V; and DRV 434 is enabled (E) to transition the PAD 412 to logic high, Vp.

In stage 3, the waveforms in FIG. 5A also illustrate the operations: waveform W1 is in a steady state condition at logic low, 0V; waveform W2 is in a steady state condition at logic low, 0V; and waveform W3 is in a steady state condition at logic high, Vp. In the stage 3 column of T1 580, all of the functional blocks continue with the same status as in stage 2: PH 452 is disabled (D); and PL 454 and DRV 434 remain enabled (E). The operation of the MODE 450 to disable four blocks, and the selective enabling of the PH, PL and DRV blocks conserves power in this example in the first mode of operation.

Figure 6A:
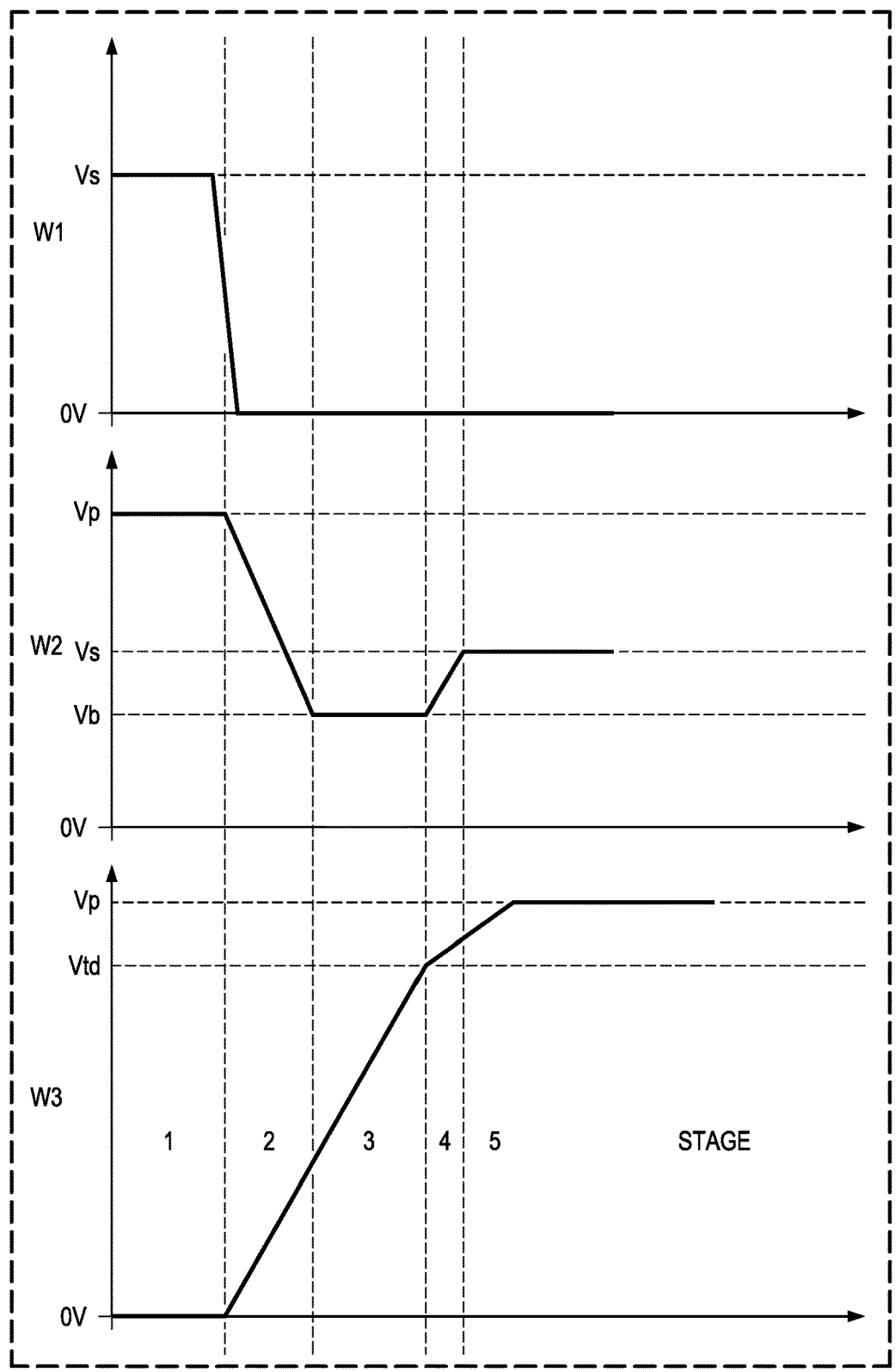

FIGS. 6A and 6B show pre-driver waveforms and a functionality table of an example p-channel pre-driver operating in the second mode, where Vp is higher than Vs. FIG. 6A shows three waveforms, W1, W2, and W3 illustrating voltages at three nodes of FIG. 4, N1 470, N2 472, N3 473, respectively. Five stages, 1 through 5 are identified in FIG. 6A. FIG. 6B is a table T2 680 that shows the status of functional blocks within the block diagram of FIG. 4 during the five stages. Status definitions are: active (A); enabled (E); and disabled (D).

For the waveforms W1, W2, W3 shown in FIG. 6A the vertical axis on each waveform is voltage in volts, and the horizontal axis is time. The top waveform W1 shows the voltage of node N1 470 identified in FIG. 4 with the logic high at system voltage Vs and the logic low at 0V. The middle waveform W2 shows the voltage of node N2 472 identified in FIG. 4 with the logic high at peripheral voltage Vp, the system voltage Vs, an intermediate bias voltage Vb and the 0V level. The bottom waveform W3 shows the voltage of node N3 473 identified in FIG. 4, with the peripheral voltage Vp, the threshold detect voltage Vtd, and the 0V level. In FIG. 6A five stages 1-5 are identified. Stage 1 is the steady state time while the waveform W3 is at logic low. Stages 2, 3 and 4 are the transition stages where the waveform W3 transitions between logic low and logic high, and stage 5 is the steady state time after W3 has reached a logic high state of voltage Vp.

In table T2 680 in FIG. 6B, the first nine rows correspond to the blocks in FIG. 4, the tenth row corresponds to the stage numbers from the waveforms in FIG. 6A. The first through fifth columns correspond to the stages 1, 2,3,4,5. The sixth and seventh columns present the identifier number and label of the blocks from FIG. 4. The letters in the cells of the first through fifth columns correspond to the status, A, E or D, of the blocks during the stages shown in FIG. 6A.

In the example second mode of operation, Vs=1.8 volts and Vp=3.3 volts, MSEL is configured for Vp=3.3 volts, and a group of two blocks 683 are always active: MODE 450 and LS 430. In the following description of block function only changes in block status are described.

During stage 1, as shown in FIG. 6A: waveform W1 is a logic high at voltage Vs; waveform W2 is a logic high at the peripheral voltage Vp; and waveform W3 is logic low at 0 volts. As shown in the stage 1 column of T2 680: PH 452 is enabled (E) and is pulling up N2 node to Vp; blocks PL 454, VB 456, PB 458, PCD 460, PD 462 and DRV 434 are disabled (D).

During stage 2, as shown in FIG. 6A: waveform W1 transitions to 0 volts; waveform W2 transitions to a bias voltage Vb; and waveform W3 begins to rise to voltage Vtd and completes the transition later in stage 4. In the stage 2 column of table T2 680: PH 452 is disabled (D) and remains disabled through stage 5; PL 454 is enabled (E) and pulls down node N2 472 towards 0 volts; VB 456 and PB 458 continued to be disabled (D); PCD 460 becomes active (A) monitoring the voltage of node N2 472 to determine when N2 472 is less than or equal to Vb; PD 462 becomes active (A) and remains active through stage 5. PD 462 monitors the voltage at PAD 412 to determine if PAD 412 is equal or greater than Vtd; and DRV 434 is enabled (E) for stages 2,3,4 and 5 to perform the transition of PAD 412.

In FIG. 6A, during stage 3: waveform W1 is steady at logic low of 0 volts; waveform W2 has reached and remains steady at voltage Vb; and waveform W3 continues to rise toward Vtd. In the stage 3 column of T2 680: PL 454 is disabled (D) and remains disabled through stage 5; VB 456 is enabled (E) pulling node N2 to Vb; PB is disabled (D); PCD 460 and PD 462 remain active (A); and DRV 434 remains enabled (E).

In FIG. 6A, during stage 4: waveform W1 remains at logic low; waveform W2 472 rises to the system voltage Vs; and waveform W3 reaches the threshold voltage Vtd and continues its rise to the peripheral voltage Vp. In the stage 4 column of T2 680: VB 456 and PCD 460 are disabled (D); PB 458 is enabled (E) pulling node N2 472 to Vs; PD 462 remains active (A); and DRV 434 remains enabled (E) to continue the transition of PAD 412 to a high voltage of Vp. PD 462 is monitoring the voltage of PAD 412. When the voltage of PAD 412 reaches threshold Vtd, PD 462 disables the bias voltage circuit VB 456 and enables PB 458, resulting in node N2 472 to be pulled to Vs by PB 458.

Returning to FIG. 6A, in stage 5: waveform W1 remains at logic low; waveform W2 is steady at system voltage Vs; and waveform W3 completes the transition to the peripheral voltage Vp. In the stage 5 column of T2 680, the activity status of the blocks remains the same as in stage 4: PB 458 is enabled (E) to keep node N2 472 pulled up to the system voltage Vs; PD remains active (A) monitoring the voltage of PAD 412; and DRV 434 is enabled (E) to maintain the output state at the peripheral voltage Vp.

The activation and deactivation of the blocks within the p-channel pre-driver ensure that the p-channel gate voltage PC and the n-channel voltage NC both transition through a range of 1.8 voltage, ensuring a symmetric rise and fall time of the output signal at the pad. Using the system voltage Vs for the n-channel rise time requires no additional bias voltages, conserving power and layout space. Creating the bias supply voltage Vb using a voltage subtraction circuit without the need of resistors also conserves power and uses minimal layout space. The bias supply circuit can be inactive when the voltage Vb is not needed, conserving static power.

FIG. 7 is a schematic of an example circuit for generating the voltage bias Vb in the p-channel pre-driver of FIG. 4. The schematic of Vbias 756 contains two MOSFET transistors, M1 and M2. M1 and M2 are p-type transistors constructed to be the same size to ensure their electrical characteristic are well matched. Peripheral voltage Vp is coupled to the source terminal of M1. System voltage Vs is coupled to the gate terminal of M1. The drain terminal of M1 is coupled to the source terminal of M2 and the output Vb 757. The drain terminal of M2 is coupled to ground and the gate terminal of M2. Other system voltages Vs and peripheral voltages Vp can be used, such as 1.2 volts and 1.8 volts, respectively, and form other example arrangements.

In operation, the gate terminal of M1 is biased at Vs and the source terminal is coupled to Vp. M1 functions as a current source with the drain voltage at Vp−Vs. M2 is always on when current is flowing through M1 and being of the same size as M1, the gate to source voltage will match M1 keeping the output node Vb 757 at the voltage Vp−Vs. In the example, in the second mode of operations, Vb=3.3 volts−1.8 volts=1.5 volts. In the case where the supply voltage Vs and the peripheral voltage Vp are equal, the first mode as described above, the bias circuit is not used and does not consume static current because M1 in FIG. 7 is cutoff (Vgs=0, which is less than the threshold voltage for turning on M1).

FIG. 8 is a flow diagram for an example method 800. In FIG. 8, the method begins at step 801, where a data signal is received by a predriver circuit for output. This corresponds to receiving a signal at the IN terminal in FIG. 4, as described hereinabove.

At step 803 a decision block determines which mode is active. If the peripheral voltage Vp is equal to the system voltage Vs, as described hereinabove, the first mode is active. In this example, the decision at step 803 is false (F) and the method proceeds to step. 805.

At step 805, the first mode has been detected. As described hereinabove, the MODE block 450 in FIG. 4, for example, outputs a signal to control other blocks in the predriver circuit when the first mode is active.

At step 807, the predriver circuit operates in the first mode and, responsive to the input data signal, supplies the PC gate control signal to a driver circuit (such as driver DRV 434 in FIG. 4) using ground or 0 Volts as the low voltage on the p-channel gate control signal, and Vs=Vp as the high voltage on the p-channel gate control signal, as shown in FIGS. 3B and 3D.

Modifications are possible in the described examples, and other example arrangements are possible within the scope of the claims

What is claimed is:

1. An apparatus, comprising:
an output pad;
a peripheral voltage lead;
first gate control signal lead;
second gate control signal lead;
a ground terminal;
a driver circuit coupled to the output pad, the driver having a first FET, a second FET, a first gate terminal, and a second gate terminal, the first FET is coupled between the peripheral voltage lead and the outpad pad, the first gate terminal is coupled to the first gate control signal lead, a second FET is coupled between the pad and the ground terminal and the second gate terminal is coupled to the second gate control signal lead; and
a predriver circuit configured to:
output a supply voltage to the first gate control signal lead in a first mode;
output a bias voltage less than the supply voltage to the first gate control signal in a second mode;
output the supply voltage to the second gate control signal in both the first and second modes.

2. The apparatus of claim 1, wherein the first FET comprises a p-channel drain extended MOS (DEMOS) transistor.

3. The apparatus of claim 2, wherein the p-channel DEMOS transistor has a source terminal coupled to the peripheral voltage lead and a drain terminal coupled to the output pad.

4. The apparatus of claim 1, wherein the second FET comprises an n-channel drain extended MOS (DEMOS) transistor.

5. The apparatus of claim 4, wherein the n-channel DEMOS transistor has a drain terminal coupled to the output pad and a source terminal coupled to the ground terminal.

6. The apparatus of claim 1, wherein the bias voltage is a voltage corresponding to a difference between a voltage at the peripheral voltage lead and the supply voltage.

7. The apparatus of claim 6 wherein the voltage at the peripheral voltage lead is 3.3 volts, the supply voltage is 1.8 volts, and the bias voltage is 1.5 volts.

8. The apparatus of claim 1, wherein the bias voltage circuit further comprises:
a third FET transistor coupled between the peripheral voltage lead and the predriver circuit; and
a second p-channel FET transistor diode coupled between the predriver circuit voltage and the ground terminal.

9. The apparatus of claim 1, wherein in the first mode, a voltage at the peripheral voltage lead is equal to the supply voltage.

10. The apparatus of claim 9, wherein in the first mode, a voltage at the peripheral voltage lead is 1.8 volts.

11. The apparatus of claim 1, wherein in the second mode, voltage at the peripheral voltage lead is 3.3 volts, and the supply voltage is 1.8 volts.

12. The apparatus of claim 1, and further comprising a mode circuit configured to indicate the first mode a voltage at the peripheral voltage lead is equal to the supply voltage, and further configured to indicate the second mode when the voltage at the peripheral voltage lead is greater than the supply voltage.

13. A method, comprising:
receiving a data signal for output to a pad, wherein the pad is driven by a driver circuit;
determining a first mode is active when a peripheral voltage at a peripheral voltage lead coupled to a predriver circuit is equal to a supply voltage at a supply voltage lead coupled to the predriver circuit;

determining a second mode is active where the peripheral voltage at the peripheral voltage lead coupled to the predriver circuit is greater than a supply voltage at the supply voltage lead coupled to the predriver circuit;

responsive to determining the first mode is active, operating the predriver circuit to output the supply voltage to the driver circuit;

responsive to determining the second mode is active, operating the predriver circuit to output a bias voltage that is less than the supply voltage to the the driver circuit.

14. The method of claim 13, further comprising:
operating the predriver circuit to cause the driver circuit to couple the peripheral voltage lead to the output pad.

15. The method of claim 13, wherein in the first mode, the supply voltage is equal to the peripheral voltage which is equal to 1.8 volts; and wherein in the second mode, the peripheral voltage is equal to 3.3 volts, the supply voltage is equal to 1.8 volts, and the bias voltage is equal to 1.5 volts.

* * * * *